United States Patent [19]

Takeuchi

[11] Patent Number: 5,017,513
[45] Date of Patent: May 21, 1991

[54] METHOD FOR MANUFACTURING A SEMICONDUCTOR DEVICE

[75] Inventor: Hiroshi Takeuchi, Yokohama, Japan
[73] Assignee: Kabushiki Kaisha Toshiba, Kawasaki, Japan
[21] Appl. No.: 466,944
[22] Filed: Jan. 18, 1990
[30] Foreign Application Priority Data

Jan. 18, 1989 [JP] Japan ................................ 1-9595

[51] Int. Cl.$^5$ ............................................ H01L 21/465
[52] U.S. Cl. .................................. 437/228; 437/229; 437/245
[58] Field of Search ............... 437/229, 245, 199, 194, 437/195, 196, 197, 198, 228; 156/659.1

[56] References Cited

U.S. PATENT DOCUMENTS

| | | | |
|---|---|---|---|
| 3,914,138 | 10/1975 | Rai-Choudhury | 437/152 |
| 4,183,781 | 1/1980 | Eldridge et al. | 437/245 |
| 4,544,416 | 10/1985 | Meador et al. | 437/229 |
| 4,572,759 | 2/1986 | Jacob | 118/620 |
| 4,680,085 | 7/1987 | Vijan et al. | 204/192.32 |
| 4,744,861 | 5/1988 | Matsunaga et al. | 437/245 |
| 4,867,799 | 9/1989 | Grebinski | 437/229 |
| 4,889,609 | 12/1989 | Cannella | 204/298.35 |

Primary Examiner—Brian E. Hearn
Assistant Examiner—Deborah Wortman
Attorney, Agent, or Firm—Oblon, Spivak, McClelland, Maier & Neustadt

[57] ABSTRACT

A method for manufacturing a semiconductor device comprises the steps of preparing a body having an insulating layer formed on a silicon substrate, an Al-Si-Cu alloy film formed on the insulating layer and an organic layer mask pattern formed on the alloy film, selectively etching a portion of the alloy film by a reactive ion etching with the mask pattern as a mask, and foreign film being left as a foreign material on a side wall of the alloy film at the step of the selective etching, the foreign material containing constituents of the treating layer and/or the underlying layer, heat-treating the body in an atmosphere containing at least oxygen and ashing the mask pattern while making the foreign film porous, the exposing, subsequent to the heat-treating step, the body to an etching step by an etching solution containing phosphoric acid and hydrofluoric acid.

7 Claims, 3 Drawing Sheets

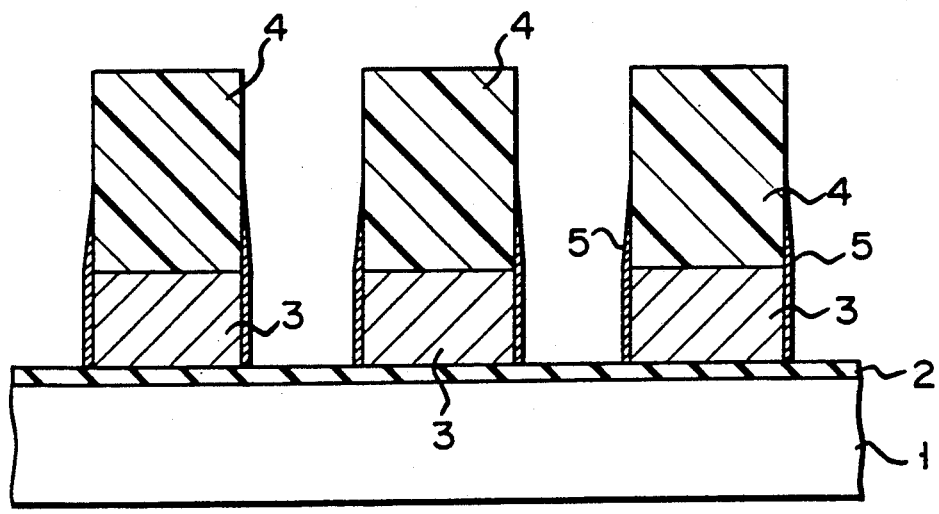
F I G. 1A
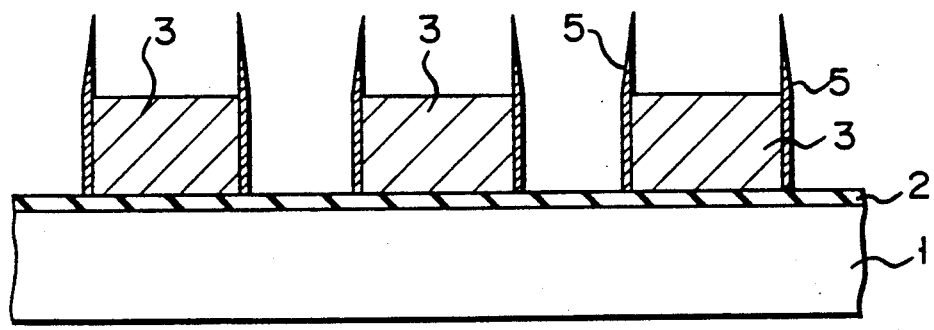
F I G. 1B
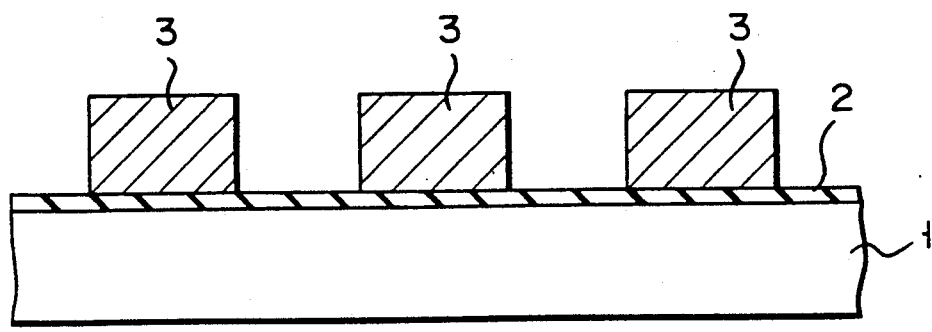
F I G. 1C

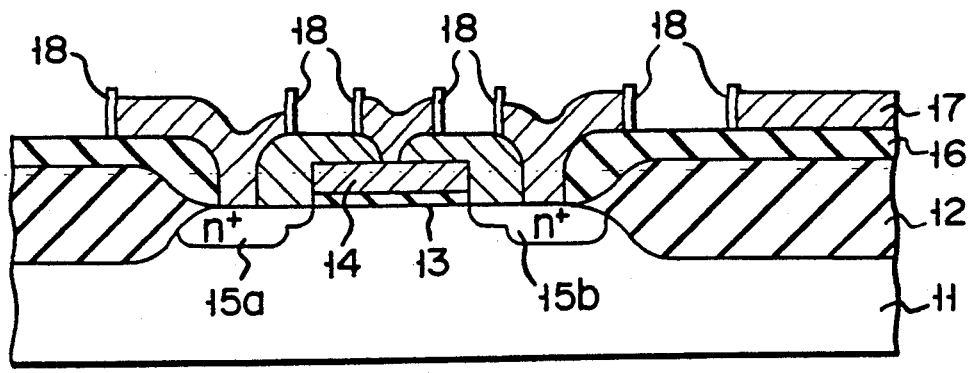
F I G. 2A
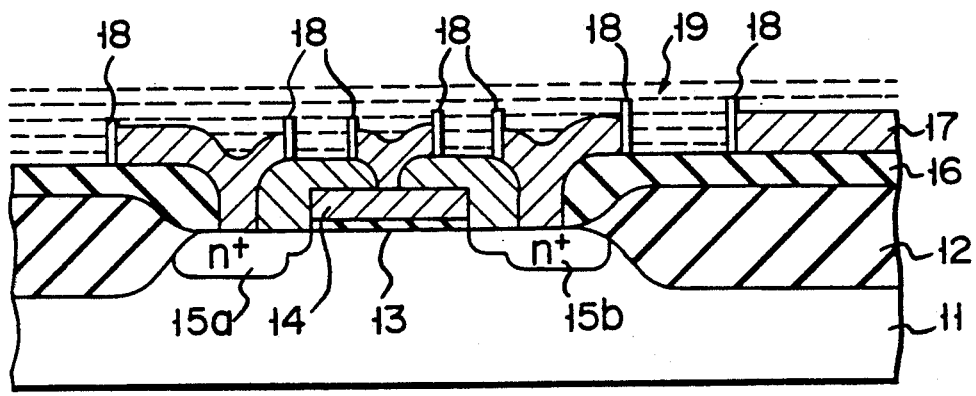
F I G. 2B
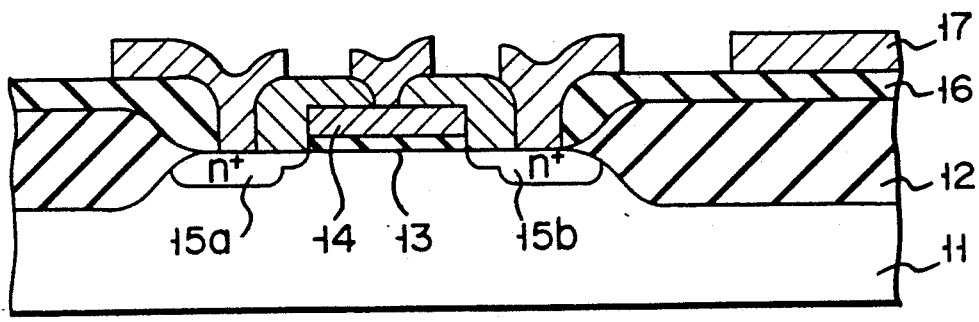
F I G. 2C

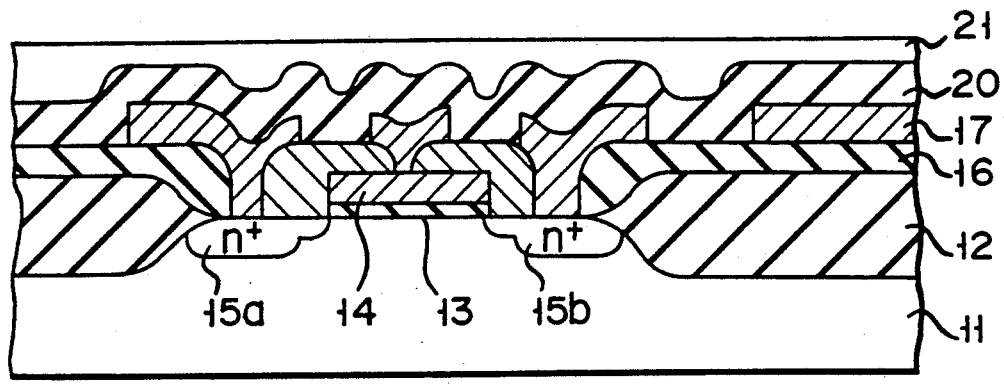
F I G. 2D.
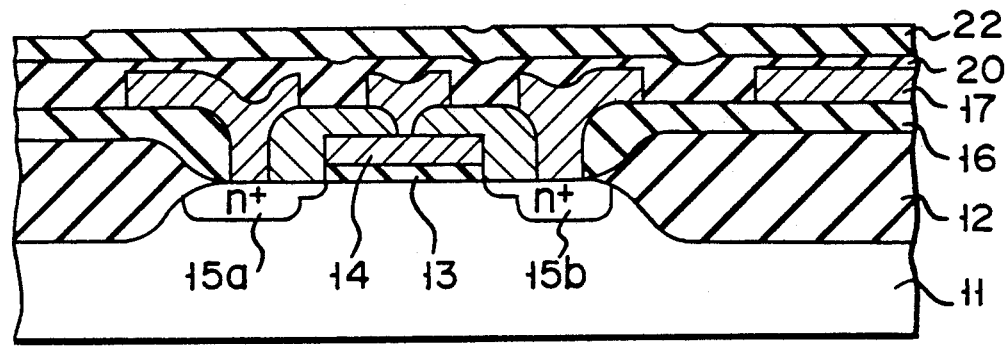
F I G. 2E
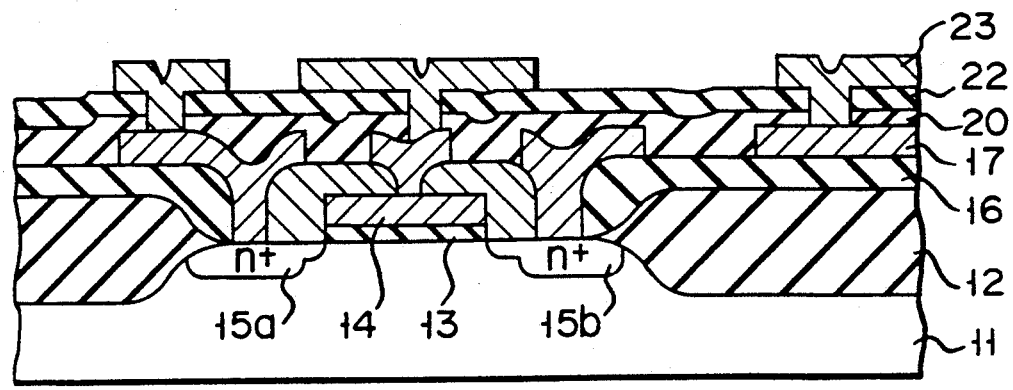
F I G. 2F

METHOD FOR MANUFACTURING A SEMICONDUCTOR DEVICE

BACKGROUND OF THE INVENTION

1. Field of the Invention

The present invention relates to a method for manufacturing a semiconductor device and, in particular, a method for manufacturing a semiconductor device which uses a reactive ion etching step in the formation of a fine pattern.

2. Description of the Related Art

Recently, attempts have been made to fabricate semiconductor devices of an improved characteristic and high integration density. In the achievement of a high integration density unit, a recent tendency is mainly toward using a microfabrication technique for forming an arbitrary pattern on a treating or etching layer with the use of a photoresist and stepper and selectively etching the layer.

For example, the submicron line dimension, such as a line width 0.7 μm, has been used in the fabrication of high-tech products, such as 4 Mbit dynamic random access memory (DRAM). In the formation of a submicron pattern layer, a photoresist pattern (a mask for etching) has a sharp side wall so as to eliminate a finishing dimension error resulting from the side etching of the mask pattern at an etching step. Further, a reactive ion etching is used in etching a treating layer by directing a gaseous ion in a direction perpendicular to the major surface of the treating layer. The etching action progresses partly due to a chemical reaction of the reactive ion with that of the treating layer and partly due to the sputtering by an incident ion. The sputtering is performed not only on the side wall of the photoresist (a mask material) but also on the side wall of the treating layer. Since the side wall of the photoresist mask pattern is not sharp in the fabrication of a conventional semiconductor device, a sputtered foreign substance deposited on the side wall of the pattern was able to be removed or, if not removed, never projected above the top surface (major surface) level, posing no appreciable problem. In the reactive ion etching step using a sharp-sided pattern, however, a foreign substance deposited on the pattern side wall is not etched away, leaving it unremoved from the rest of the semiconductor body. The foreign substance is not removed by a subsequent oxide plasma ashing step made on the photoresist and is left as a foreign projection. The left foreign substance (sputtered foreign film) is also not removed in the subsequent formation of a layer during the manufacture of the semiconductor device and penetrates that layer.

Japanese Patent Publication 54-18973 proposes removing a deposition of a foreign film. This method comprises, subsequent to forming of a mask pattern on a treating layer, performing an etching step to remove a foreign film or substance o the side wall of the mask pattern or on a treating layer by a wet chemical etching method using an inorganic acid and performing a plasma ashing step to remove the mask pattern.

This method encounters a drawback in that the etching layer per se is adversely affected due to a local action of the etching to produce many defective products. This is probably due to the fact that, because of a progress of the chemical etching prior to the removal of the resist, an element such as chlorine present in small quantity in the resist as derived from an etching gas acts catalytically on the etching layer to progress the etching action there.

With a semiconductor device of high integration density, the formation of a fine pattern is an important requisite. For this reason, the major tendency is toward the use of the sharp-sided photoresist pattern and the microfabrication using the reactive ion etching method. In this case, a foreign projection is deposited on the side wall of the pattern at the time of such etching, causing a defective isolation and defective configuration and hence a malfunction in the semiconductor device. There is a growing demand for an effective method for the removal of such foreign film or projection.

SUMMARY OF THE INVENTION

It is accordingly the object of the present invention to provide a method for manufacturing a semiconductor device of enhanced reliability which can very highly achieve the microfabrication of a submicron area on the semiconductor device.

In the aspect of the present invention, there is provided a method for manufacturing a semiconductor device which comprises:

forming a treating layer on a semiconductor substrate;

forming an organic film mask pattern on the treating layer;

treating the treating layer by a reactive ion etching;

removing the organic film mask pattern by an oxide ashing method using at least oxygen molecules; and exposing, subsequent to the removing step, at least the treating layer and/or its underlying layer to an etching step using an etching medium.

The etching medium may be liquid-like and gaseous. No particular restriction is made to the type of the treating layer and the present invention can also be applied to any other connection layer, such as aluminum and silicon semiconductor. If the treating layer is formed of aluminum or aluminum alloy, a mixed solution containing phosphoric acid, hydrofluoric acid and alcohol as principal constituents is desirable as the etching medium.

By etching the treating layer by the reactive ion etching method and removing the organic film mask pattern by the oxygen ashing method using oxygen molecules, organic constituents in a foreign film deposited on the side wall of the treating layer are also ash-removed, making a remaining foreign film porous and bulkier. With the use of a proper etching medium, it is possible to selectively and readily remove the remaining foreign film without exerting any bad effect on the treating layer and its underlying layer.

BRIEF DESCRIPTION OF THE DRAWINGS

FIGS. 1A to 1C are cross-sectional views showing the steps of manufacturing a semiconductor device according to one embodiment of the present invention; and FIGS. 2A to 2F are cross-sectional views showing the steps of manufacturing a semiconductor device according to another embodiment of the present invention.

DETAILED DESCRIPTION OF THE PREFERRED EMBODIMENTS

Example 1

The first embodiment of the present invention will be explained below with reference to FIGS. 1A to 1C.

A 200 Å-thick silicon oxide film 2 was formed by a thermal oxidation method on a silicon substrate 1 and a 4000 Å-thick polysilicon film 3 was formed by a vacuum CVD method on the whole surface of the silicon oxide film, which is doped with a phosphorus impurity of $1 \times 10^{21}$ atoms/cm$^3$. Then an organic photoresist mask pattern 4 of a 0.7 μm line-and-space array was formed by a 1/5 reduction exposing device on the surface of the polysilicon film 3. The polysilicon film 3 was partially etched, by a reactive ion etching method, down to the surface of the silicon oxide film 2, as shown in FIG. 1A, under the following conditions:

a CCl$_4$ gas: 100 cc/min.
an He gas: 100 cc/min.
a pressure: 0.2 torr
a high frequency power applied: 0.5 W/cm$^2$.

Then the whole substrate was oxygen plasma ashed for 30 minutes at an oxygen pressure of 1 torr and an applied high frequency power of 3 W/cm$^2$ and the photoresist mask was removed from the upper surface of the polysilicon film 3 as shown in FIG. 1B. The resultant semiconductor structure was immersed, for 30 seconds, in an etching solution consisting of a mixed solution of the acids hydrofluoric, nitric and acetic in a 5:20:700 weight ratio. In this weight ratio, the polysilicon film 3 to be treated was etched at a rate as low as 200 Å per minute, that is, hardly etched, and only a foreign projection 5 deposited on the side wall of the polysilicon pattern was able to be selectively removed, as shown in FIG. 1C, without affecting a prepared pattern accuracy.

The selective etching of the foreign projection 5 was achieved for the reason as set forth below.

The foreign projection 5 deposited at a time of the reactive ion etching may be regarded as a mixed substance of the polysilicon film (a film subjected to a photoresist patterning) and/or its underlying silicon oxide film. Upon the removal of the photoresist (mask material) by the oxygen plasma asching method in the etching step, organic constituents in the foreign projection on the side wall of the photoresist are also ash-removed from the semiconductor structure. As a result, the remaining foreign substance on the side wall of the layer is made porous in nature and hence bulkier in its surface area and is selectively etched with the mixed solution of the acids hydrofluoric, nitric and acetic (the weight ratio =5:20:700).

According to the embodiment of the present invention, it has been found that the foreign substance on the side wall of the semiconductor layer is better etched even with a fine pattern of a 0.7 μm line-and-space configuration. Further, it has been found possible to manufacture a semiconductor device including submicron gate transistors if the present invention is applied to the microfabrication of a polysilicon film which is a gate electrode material of MOS transistors.

Example 2

The second embodiment of the present invention will be explained below with reference to FIGS. 2A to 2F.

This is an example of forming a semiconductor device including a multi-wiring layer structure of an Al-Si-Cu alloy.

FIG. 2A shows a state immediately following the formation of a first wiring layer 17. In FIG. 2A, 11, 12, 13, 14, 15a, 15b and 16 show a silicon substrate a field oxide film, a gate oxide film, a polysilicon gate electrode, a source diffusion layer, a drain diffusion layer, and a first insulating interlayer. A first wiring layer pattern 17 was formed as will be set forth below. First, an Al-Si-Cu (Si: 10%, Cu: 0.5%) alloy film was formed on the semiconductor layer to a thickness of 0.8 μm by a magnetron sputtering method, a predetermined photoresist mask pattern was formed on the alloy film, and the alloy film was selectively etched, for 70 seconds, at a pressure of 1.0 torr and a high frequency power of 13.56 MHz: 3 W/cm$^2$ with the use of an etching gas (Cl$_2$:CCl$_4$:N$_2$=20:20:1000 cc/minute). Then the photoresist mask pattern was removed, by the oxygen plasma ashing method, in a gas flow of 50 cc/min. at a pressure of 0.9 torr and a high frequency power of 13.5 MHz: 0.4 W/cm$^2$ and a foreign substance 18 was deposited as a foreign projection on the side wall of the first wiring layer pattern as shown in FIG. 2A.

The resultant semiconductor structure was immersed for 1 minute in a solution of phosphoric acid, hydrofluoric acid and alcohol in a volume ratio of 100:1:100 and washed with pure water. As a result, a normal wiring layer pattern 17 was obtained with the foreign film (foreign substance) selectively removed from the rest of the semiconductor structure. As shown in FIG. 2D, a first insulating film 20 of 1.2 μm thick was deposited, as a second layer, on the semiconductor structure by a plasma CVD method using a mixed gas of silane and nitrous oxide (N$_2$O). A photoresist 21 was wholly coated on the surface of the insulating film 20 so as to implement a subsequent resist etch-back method. In this state, the etch-back treatment was performed and the surface of the insulating film 20 was planarized. As shown in FIG. 2E, a second insulating layer 22 was formed on the first insulating film 20. The insulating films 20 and 22 are opened in proper places and an aluminum alloy wiring layer pattern 23 was formed as a second pattern on the resultant semiconductor structure to obtain a semiconductor device as shown in FIG. 2F. The semiconductor device thus obtained revealed neither a breakage on the aluminum alloy wiring layer pattern 23 nor a short-circuiting between the wiring layer patterns.

Example 3

A 1000 Å-thick thermal oxidation film was formed on a (100) face oriented silicon substrate surface and a 10000 Å-thick Al-Si-Cu film was formed, by sputtering, on the thermal oxidation film. A 1.5 μm-thick mask pattern (a positive resist) was formed on the Al-Si-Cu film in order for a wiring layer pattern of 12 m to be formed at a line-and-space interval of 0.8 μm. The Al-Si-Cu film was selectively etched, for 100 seconds, at a pressure of 100 Pa and a high frequency power of 500 W with the use of an etching gas (BCl$_3$:Cl$_2$:Co:He =1000 cc/min : 500 cc/min : 50 cc/min : 2000 cc/min) to form a first wiring layer pattern. At this time, a foreign film was deposited on the side wall of the wiring layer pattern as in FIG. 2A.

The photoresist mask was removed by performing an oxygen plasma ashing treatment in an O$_2$ flow of 100 cc/min at a pressure of 130 Pa and a high frequency power of 500 W.

The resultant semiconductor structure was wholly immersed in a solution of phosphoric acid, hydrofluoric acid and alcohol (100:1:100 volume ratio) and washed with pure water.

A second wiring layer pattern was formed by the same treatment as in Example 2 in order for the same length of the wiring layer pattern as in Example 2 to be obtained at the same line-and-space interval. Test was made for a breakage and short-circuiting. As a result, a 99.4% yield was obtained.

Comparative Example

The same treatment as in Example 3 was conducted except that an oxygen plasma ashing treatment step and a step of an immersion into a mixed solution of phosphoric acid, hydrofluoric acid and alcohol were reversed. By so doing, a multi-wiring layer was formed on a resultant semiconductor structure. Test was made for a breakage on the wiring layer pattern and for a short-circuiting across a second wiring layer pattern. A 13% yield was gained.

An etching solution for removing the foreign substance 5 is not restricted to a mixed solution of a phosphoric acid, hydrofluoric acid and alcohol. A 1% aqueous chlorine solution may be used, for example.

Although, in the aforementioned embodiment, the solution etching is employed to remove any foreign projection, other proper etchings may be used:

1. Photoetching is performed on a whole semiconductor substrate structure, in a gas flow of nitrogen trifluoride (NF$_3$:100cc/min) and chlorine (Cl$_2$: 150 cc/min), at a pressure of 20 torrs for 40 seconds under the excitation of light by an Hg-Xe lamp (light source). The same result can also be obtained by using scattering light in place of parallel light or parallel collimation light for use on an ordinary light-excitable etching apparatus (microfabrication).

2. Plasma etching is performed on a whole semiconductor substrate structure, in a gas flow of carbon tetrafluoride (CF$_4$: 200 cc/min) and oxygen (O$_2$: 50 cc/min), in the plasma generation chamber under a pressure of 1.0 torr and high frequency power (0.1 W/cm$^2$: 13.56 MHz) for 40 seconds.

The same effect can also be obtained on a plasma generation chamber/etching chamber separate type etching device using a microwave power in place of the aforementioned high frequency power.

As set forth above, according to the present invention, a semiconductor device is provided which has a fine pattern of a sharp cross-sectional edge and hence ensures high reliability and high yield.

What is claimed is:

1. A method for manufacturing a semiconductor device comprising the steps of:
   forming a treating layer on a semiconductor substrate;
   forming an organic film mask pattern on the treating layer;
   treating the treating layer by a reactive ion etching;
   removing the organic film mask pattern by an oxygen ashing method using at least oxygen molecules; and
   exposing, subsequent to the removing step, at least the treating layer and/or its underlying layer to an etching step using an etching medium.

2. The method according to claim 1, wherein said etching medium is in the form of a solution.

3. The method according to claim 2, wherein said treating layer is formed of aluminum or an aluminum alloy and said solution contains phosphoric acid and hydrofluoric acid.

4. The method according to claim 2, wherein said etching medium is in the form of a gas.

5. The method according to claim 4, wherein said gas is excited by light.

6. The method according to claim 4, wherein said gas is excited by a high frequency wave or a microwave.

7. A method for manufacturing a semiconductor device comprising the steps of:
   preparing a body having an underlying layer formed on a substrate, a treating layer formed on the underlying layer and an organic layer mask pattern formed on the treating layer;
   selectively etching a portion of the treating layer by a reactive ion etching with the mask pattern as a mask, an foreign film being left as a foreign material on a side wall of the treating material at the step of the selective etching, the foreign material containing constituents of the treating layer and/or the underlying layer;
   heat-treating the body in an atmosphere containing at least oxygen and ashing the mask pattern while making the foreign film porous; and
   exposing, subsequent to the heat-treating step, the body to an etching step by an etching medium, which etches at least the treating layer and/or its underlying layer, and removing the porous film.

* * * * *